United States Patent [19]

Isoda

[11] Patent Number: 4,613,541
[45] Date of Patent: Sep. 23, 1986

[54] ELECTRONIC DEVICE USING ELECTRON TRANSPORT PROTEINS

[75] Inventor: Satoru Isoda, Takarazuka, Japan

[73] Assignee: Mitsubishi Denki Kabushiki Kaisha, Tokyo, Japan

[21] Appl. No.: 815,068

[22] Filed: Dec. 31, 1985

[30] Foreign Application Priority Data

Jan. 12, 1985 [JP] Japan ................................. 60-3602
Jan. 12, 1985 [JP] Japan ................................. 60-3603

[51] Int. Cl.$^4$ ..................... B32B 9/00; B32B 15/04; H01B 5/00
[52] U.S. Cl. ............................. 428/212; 174/126 R; 427/338; 427/414; 428/459; 428/478.2
[58] Field of Search .............. 428/212, 459, 478.2; 427/338, 414; 174/126 R, 126 CP

[56] References Cited

U.S. PATENT DOCUMENTS 3,966,580  6/1976  Janata et al. ................. 428/478.2
4,103,064  7/1978  McAlear et al. .............. 428/478.2
4,103,073  7/1978  McAlear et al. .............. 428/478.2
4,541,908  9/1985  Niki et al. ..................... 427/414

OTHER PUBLICATIONS

"Bioconductors—Beyond VLSI" by James H. McAlear et al, IEEE-Japan, App. Phys., Sep. 7-11, 1981.
"Towards Three-Dimemsional Biomolecular Logic" by James H. McAlear et al, IEEE Computer Society MEDCOMP82, Sep. 1982.

Primary Examiner—William J. Van Balen
Attorney, Agent, or Firm—Lowe Price LeBlanc Becker & Shur

[57] ABSTRACT

An electronic device comprises a substrate (16) of glass, a plurality of elongated electrodes (17) which are provided in parallel with each other on the glass substrate, a first electron transport protein film (18) prepared by cytochrome c formed on the electrodes, a second electron transport protein film (19) of flavodoxin adhered and joined on the first electron transport protein film and a plurality of elongated electrodes (20) provided in parallel with each other on the second electron transport protein film. Cytochrome c is different in redox potential from flavodoxin, whereby rectifying characteristics are attained in the device in a molecular level by junction of the first electron transport protein film (18) and the second electron transport protein film (19).

22 Claims, 14 Drawing Figures

FIG. 4A
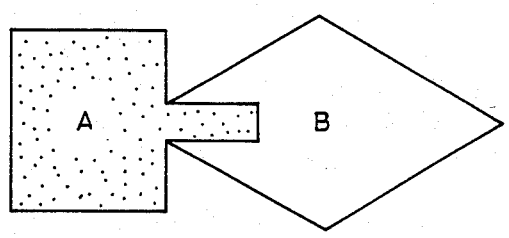
FIG. 4B
NEGATIVE
REDOX POTENTIAL OF PROTEIN "A"
REDOX POTENTIAL
REDOX POTENTIAL OF PROTEIN "B"
POSITIVE
FIG. 5A
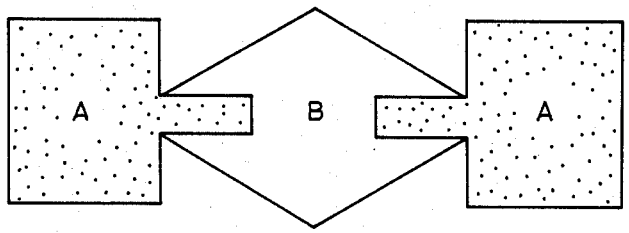
FIG. 5B
NEGATIVE
REDOX POTENTIAL OF PROTEIN "A"
REDOX POTENTIAL
REDOX POTENTIAL OF PROTEIN "B"
POSITIVE

ELECTRONIC DEVICE USING ELECTRON TRANSPORT PROTEINS

BACKGROUND OF THE INVENTION

1. Field of the Invention

The present invention relates to an electronic device using electron transport proteins, and more specifically, it relates to an electronic device having rectifying characteristics or at least one of transistor and switching characteristics, which device is implemented in hyperfine size in biomolecular level by using electron transport proteins different in redox potential from each other as material therefor.

2. Description of the Prior Art

FIG. 1 is a sectional view showing a diode element in metal-oxide-semiconductor (MOS) structure employed in a conventional integrated circuit. Referring to FIG. 1, an n-type region 2 is formed on a p-type silicon substrate 1, and a p-type region 3 is partially formed in the n-type region 2. Further, an n-type region 4 is partially formed in the p-type region 3, followed by formation of $SiO_2$ films 5 on the respective said regions. An electrode 7 is provided in contact with the p-type region 3, while an electrode 6 is provided in contact with the n-type region 4. As shown in FIG. 1, p-n junction is formed between the electrodes 6 and 7 by the junction of the p-type region 3 and the n-type region 4, thereby to attain diode characteristics.

FIG. 2 is a sectional view of a field-effect transistor (FET) employed in a conventional integrated circuit. Referring to FIG. 2, two $p^+$-type layers 103 are formed in an n-type silicon substrate 101 while a channel region 102 is formed between the $p^+$-type layers 103. $SiO_2$ films 104 are formed on the surface of the substrate 101 while provided are a source electrode 105 in contact with one $p^+$-type layer 103, a gate electrode 106 on the channel region 102 through the $SiO_2$ film 104 and a drain electrode 107 in contact with the other $p^+$-type layer 103 respectively. Transistor or switching operation of the conventional FET as shown in FIG. 2 is controlled by gate voltage which is applied to the gate electrode 106. Namely, current carriers in the surface layer between the source and drain electrodes 105 and 107 are changed in number in response to the gate voltage, thereby to control the current.

The conventional diode and transistor elements in the aforementioned structure can be hyperfinely processed, whereby LSIs of 256 Kbits employing the respective elements of the aforementioned structure are now put into practice. In order to improve such elements in storage capacity and arithmetic speed, the elements themselves must indispensably be in hyperfine structure, whereas mean free paths of electrons are substantially equalized to scales of the elements in hyperfine patterns of about 0.2 $\mu$m in elements using Si and hence the independency of the elements cannot be maintained. Thus, it is anticipated that maturing silicon technology may run into a blank wall in the near future, and hence required is a VLSI based on a new principle which can crack the 0.2 $\mu$m barrier.

On the other hand, the idea of an electronic device using proteins has already been known in the art such that, for example, methods of forming fine metal patterns with respect to protein films are disclosed in an article by James H. McAlear and John M. Wehrung entitled "Bioconductors—Beyond VLSI", IEEE-Japan, App. Phys. Sept. 7-11, 1981 and U.S. Pat. No. 4,103,064 granted to James H. McAlear et al., entitled "Microdevice substrate and Method for Making Micropattern Devices", Jan. 25, 1978. Further, a method of forming monomolecular protein films and molecular logic elements are disclosed in an article by James H. McAlear and John M. Wehrung entitled "Towards Three-Dimensional Biomolecular Logic", IEEE Computer Society MEDCOMP82, Sept. 1982. However, not yet known is an idea of attaining rectifying and transistor characteristics using electron transport proteins.

SUMMARY OF THE INVENTION

Briefly stated, the present invention provides an electronic device which comprises a first electron transport protein film prepared by an electron transport protein having a first redox potential, a second electron transport protein film prepared by an electron transport protein having a second redox potential which is different from the first redox potential and joined to the first electron transport protein film, first electrodes connected to the first electron transport protein film and second electrodes connected to the second electron transport protein film, and the electronic device has diode characteristics.

In another aspect of the present invention, an electron device comprises a first electron transport protein film prepared by an electron transport protein having a first redox potential, a second electron transport protein film prepared by an electron transport protein having a second redox potential which is different from the first redox potential and joined to the first electron transport protein film, a third electron transport protein film prepared by an electron transport protein having a third redox potential which is different from the second redox potential and joined to the second electron transport protein film, first electrodes connected to the first electron transport protein film, second electrodes connected to the second electron transport protein film and third electrodes connected to the third electron transport protein film, and the electronic device has at least one of transistor and switching characteristics.

Accordingly, a principal object of the present invention is to provide an electronic device which is implemented in hyperfine element size of several 10 to several 100 Å by using biomaterial thereby to attain a high-speed integrated circuit of high density.

A principal advantage of the present invention is that diode, transistor or switching characteristics can be generated by joining at least two types of electron transport protein films having different redox potentials.

These and other objects, features, aspects and advantages of the present invention will become more apparent from the following detailed description of the present invention when taken in conjunction with the accompanying drawings.

BRIEF DESCRIPTION OF THE DRAWINGS

FIG. 4A is a typical diagram showing an A-B type electron transport protein complex;
}

FIG. 4B is a diagram showing redox potentials of the electron transport protein complex as shown in FIG. 4A;

FIG. 5A is a typical diagram showing an A-B-A type electron transport protein complex;

FIG. 5B is a diagram showing redox potentials of the electron transport protein complex as shown in FIG. 5A;

DESCRIPTION OF THE PREFERRED EMBODIMENTS

Description is now made on the principle and function of the present invention with reference to the accompanying drawings.

In biomembranes of microorganisms and endosporia of mitochondria which are higher organisms, there are enzyme proteins for extracting electrons from reducing chemical material such as $H_2$, organic acid and NAD(P)H (Nicotineamide Adenine Dinucleotide (Phosphate)) as well as a plurality of types of proteins (hereinafter referred to as electron transport proteins) having electron transport functions for carrying the electrons in predetermined directions of the biomembranes although the functions thereof are different from each other. The electron transport proteins are embedded in the biomembranes in regular orientation, to be in specific intermolecular arrangement so that electron transport is caused between the molecules. Thus, the electron transport proteins are accurately arranged in chain in the biomembranes and hence the electrons can flow along the chain of the proteins and the movement of the electrons can be controlled in a molecular level.

Figure 1:
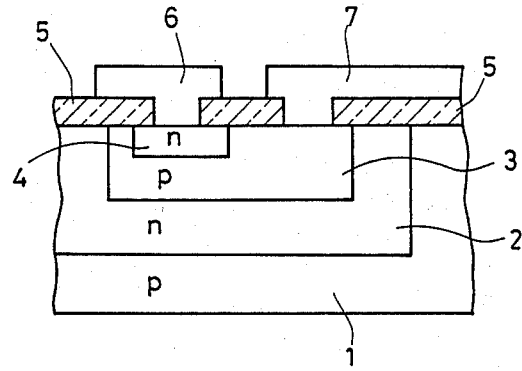
FIG. 1 is a sectional view showing a conventional diode in MOS structure.
Figure 2:
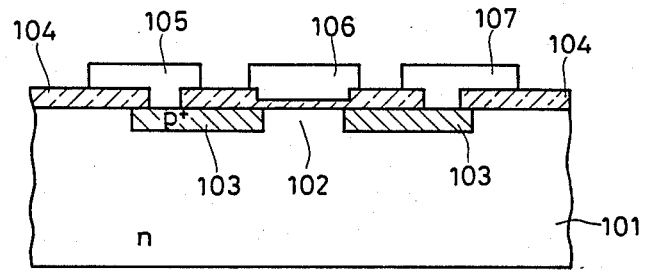
FIG. 2 is a sectional view of a conventional FET.
Figure 3:
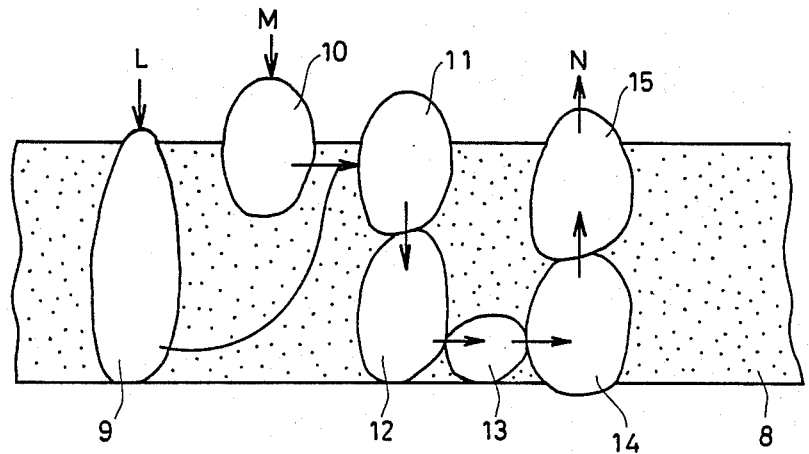
FIG. 3 is a typical diagram showing an electron transport system of an endosporium of a mitochondrion.

FIG. 3 typically shows an electron transport system of an endosporium of a mitochondrion as an example of the chain of electron transport proteins (electron transport system). Referring to FIG. 3, embedded in the endosporium 8 of the mitochondrion are an electron transport protein (NADH-Q reductase) 9, an electron transport protein (succinic dehydrogenase) 10, an electron transport protein (cytochrome b) 11, an electron transport protein (cytochrome $c_1$) 12, an electron transport protein (cytochrome c) 13, an electron transport protein (cytochrome a) 14 and an electron transport protein (cytochrome $a_3$) 15 in regular arrangement. Arrows shown in FIG. 3 are indicative of directions in which electrons flow. In an entry side, symbols L and M denote NADH and succinic acid, which are reducing organisms respectively. On the other hand, the electrons are finally delivered to oxygen in an exit side N, to produce water.

The electron transport proteins as shown in FIG. 3 show oxidation-reduction (redox) reaction in electron transport, and are capable of making electrons flow from negative redox potential levels of the respective electron transport proteins to positive redox potential levels.

According to recent study, it has been recognized that it is possible to form, in addition to electron transport protein complexes present in vibo, electron transport complexes having mutually specific arrangement of structure capable of causing electron transport in vitro.

Therefore, it may be considered that two types of electron transport proteins A and B, which are different in redox potential from each other, can be accumulated in two layers in the form of A-B thereby to form junction having rectifying characteristics due to the difference in redox potential, and further, it may be considered that these electron transport proteins can be accumulated in three layers in the form of A-B-A thereby to form junction having transistor or switching characteristics due to the difference in redox potential.

FIG. 4A is a typical diagram showing an A-B type electron transport protein complex and FIG. 4B is a diagram showing redox potentials thereof. The redox potentials of the A-B type electron transport protein complex are similar in property to those of p-n junction by combination of an n-type semiconductor and a p-type semiconductor, and are expected to have rectifying characteristics.

FIG. 5A is a typical diagram showing an A-B-A type electron transport protein complex, and FIG. 5B is a diagram showing redox potentials thereof. The redox potentials of the A-B-A type electron transport protein complex are similar in property to those of p-n-p junction by combination of an n-type semiconductor and p-type semiconductors, and are expected to have transistor or switching characteristics.

The aforementioned effect can be expected by using three types (A, B and C) of electron transport proteins which are different in redox potential from each other and accumulating the same in three layers in the form of A-B-C.

Figure 6:
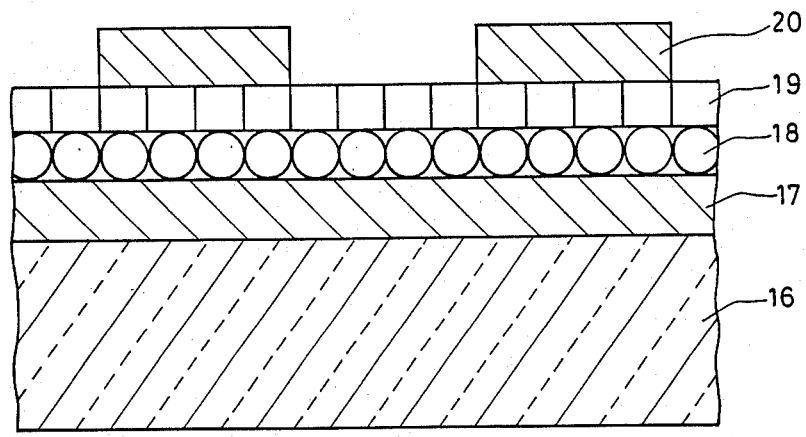
FIG. 6 is a typical sectional view showing an apparatus in which a diode element according to an embodiment of the present invention is assembled.
Figure 7:
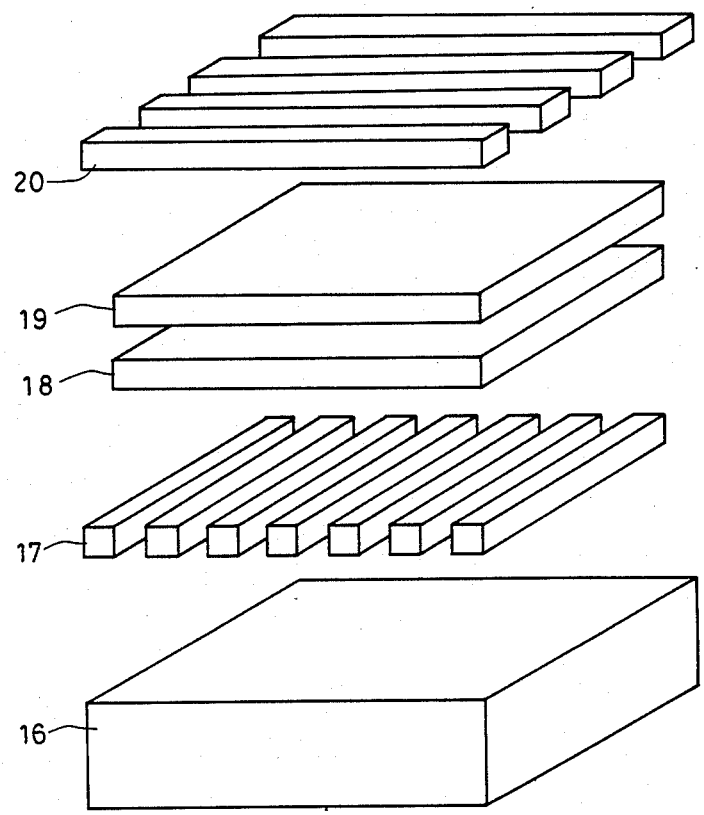
FIG. 7 is an exploded perspective view of the apparatus in which the diode element according to the embodiment of the present invention is assembled.

FIG. 6 is a typical sectional view showing an apparatus in which a diode element according to an embodiment of the present invention is assembled, and FIG. 7 is an exploded perspective view thereof. Referring to FIGS. 6 and 7, a substrate 16 of glass is provided thereon with a plurality of elongated electrodes 17 made of metal such as Ag, Au or Al, which electrodes are formed in parallel with each other. A first electron transport protein film 18 prepared by cytochrome c, which is an electron transport protein, is formed on these electrodes 17, while a second electron transport protein film 19 prepared by flavodoxin, which is an electron transport protein, is accumulatedly adhered and joined on the first electron transport protein film 18. On the second electron transport protein film 19, a plurality of elongated electrodes 20 are provided in parallel with each other, in a direction perpendicular to the electrodes 17.

The Langmuir-Blodgett method is well known as a method of forming monomolecular films using cytochrome c and flavodoxin as electron transport proteins and accumulated films thereof. The said method is described in detail in, e.g., (1) Irwing Langmuir: Journal of Japanese Electric Society, Vol. 55, April 1935, pp. 204–213, (2) K. Blodgett: Journal of American Chemical Society, Vol. 57, 1935, p. 1007, (3) Michio Sugi et al.: Solid-State Physics, Vol. 17, 1982, pp. 744–752, and (4) Journal of Colloid and Interface Science, Vol. 68, 1979, pp. 471–477. For example, a solution of cytochrome c is dripped in a water vessel to form a monomolecular film of cytochrome c on the water surface. A substrate 16 provided with electrodes 17 is vertically inserted and dipped in the water vessel formed with the cytochrome c film, so that the cytochrome c film is adhered and joined to the substrate 16 having the electrodes 17 to form a first electron transport protein film 18, which in turn is taken out from the water vessel. Although the substrate 16 is inserted and dipped in the water vessel in the above case, the cytochrome c film can in place be vertically lifted from the water surface to be adhered and joined to the substrate 16. Then a solution of flavodoxin is dripped in the water vessel, to form a monomolecular film of flavodoxin on the water surface. The substrate 16 previously provided with the first electron transport protein film 18 is vertically inserted and dipped in the water vessel having the flavodoxin film whereby the flavodoxin film is adhered and joined to the first electron transport protein film 18 to form a second electron transport protein film 19, which in turn is taken out from the water vessel. Then metal thin films are formed on the second electron transport protein film 19 on the substrate 16 at such a low temperature that the electron transport proteins are not broken, through an ion beam method, a molecular beam method or an evaporation method, thereby to obtain electrodes 20.

The first and second electron transport protein films 18 and 19 may be monomolecular films respectively, or may in place be formed by overlapping different types of electron transport protein films. In the latter case, redox potential difference between the electron transport proteins forming the overlapped electron transport protein films is selected to be smaller than redox potential difference between the electron transport proteins of the first and second electron transport protein films. Redox potentials of various electron transport proteins are described in "Tanpakushitsu Kakusan Koso" by Tsunehiro Takano, 27, 1982, p. 1543, and redox potential difference between cytochrome c and flavodoxin is about 665 mV. Lipid or fatty acid may be previously mixed into the solutions of the electron transport proteins dripped on the water surface to form the films to be adhered and joined to the substrate, so that the electron transport protein films are adjusted in orientation while the said lipid or fatty acid serves to support the protein molecules.

In order to improve electron transfer between Au electrodes and electron transport protein films, the Au electrodes may be subjected to chemical modification by 4,4'-bipyridgl, 2,2'-bipyridgl or the like.

Figure 8:
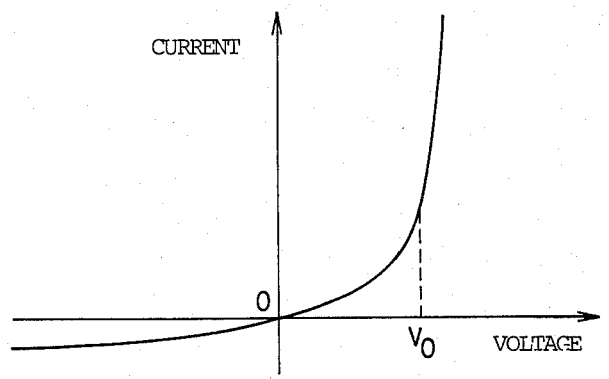
FIG. 8 is a current-voltage characteristic diagram of the diode element according to the embodiment of the present invention.

FIG. 8 is a diagram showing current(I)-voltage(V) characteristics, i.e., rectifying characteristics in case of applying voltage V to electrodes 20 with respect to electrodes 17. In FIG. 8, symbol $V_0$ indicates redox potential difference between cytochrome c and flavodoxin, which difference is about 665 mV. The redox potentials are considered to be changed by the structure of the present invention and the voltage application similarly to those in a conventional semiconductor diode (p-n junction type), whereby the rectifying characteristics are attained by the aforementioned structure in the device in a molecular level.

Enzyme may be employed to supply electrons to the electron transport proteins.

Examples of the electron transport proteins are non-heme iron-sulfur protein, cytochrome c protein, cytochrome b protein, flavodoxin, plastocyanin, thioredoxin and the like, and combination of first and second electron transport proteins selected from the same is so selected that orientation between molecules and orientation with respect to the substrate provided with the electrodes are suitable for electron transport.

Further, the electron transport proteins are preferably oriented by the Langmuir-Blodgett method etc. through specificity in interaction between different types of electron transport proteins to be in specific molecular arrangement in the same type of electron transport protein film and in different types of electron transport protein films so that electron transfer is caused in the units of the electron transport protein molecules vertically to accumulated films while no such electron transfer is caused between the electron transport protein molecules in a horizontal direction with respect to the accumulated surfaces.

Figure 9:
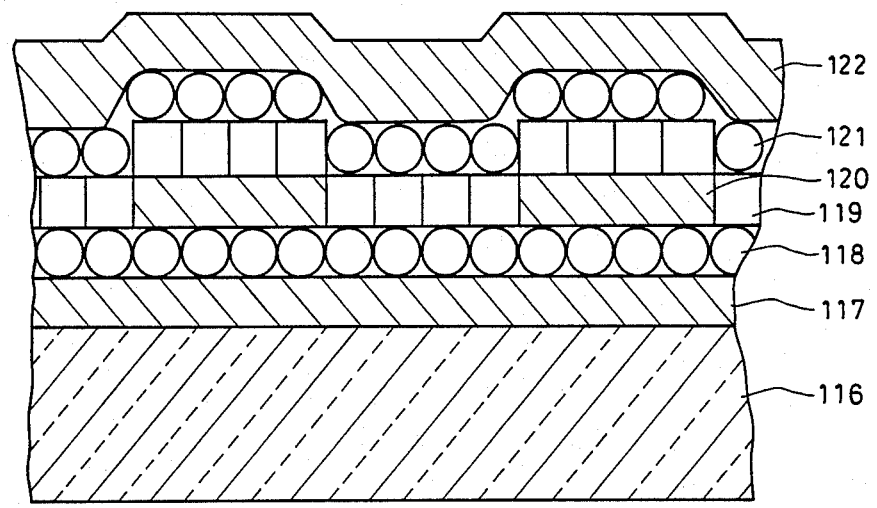
FIG. 9 is a typical sectional view showing an apparatus in which a transistor element according to an embodiment of the present invention is assembled.
Figure 10:
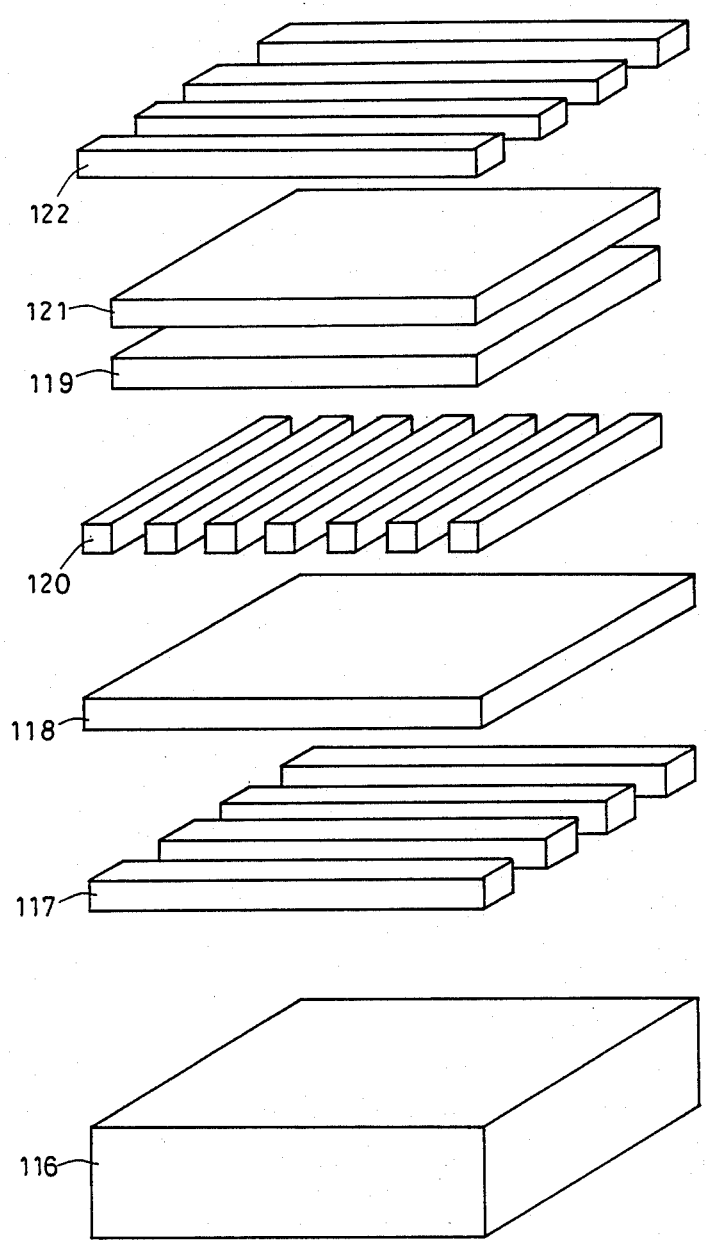
FIG. 10 is an exploded perspective view of the apparatus in which the transistor element according to the embodiment of the present invention is assembled.

FIG. 9 is a typical sectional view showing an apparatus in which a transistor element according to an embodiment of the present invention is assembled, and FIG. 10 is an exploded perspective view thereof. Referring to FIGS. 9 and 10, a substrate 116 of glass is provided thereon with a plurality of elongated electrodes 117 of metal such as Ag, Au or Al, which electrodes are formed in parallel with each other. Formed on the electrodes 117 is a first electron transport protein film 118 prepared by flavodoxin, which is an electron transport protein. The first electron transport protein film 118 is provided thereon with a plurality of elongated electrodes 120 which are formed in parallel with each other perpendicularly to the electrodes 117. A second electron transport protein film 119 prepared by cytochrome c, which is an electron transport protein, is accumulatedly adhered and joined to the first electron transport protein film 118 as well as joined to the electrodes 120. On the second electron transport protein film 119, further, a third electron transport protein film 121 prepared by flavodoxin, which is an electron transport protein, is accumulatedly adhered and joined. The third electron transport protein film 121 is provided thereon with a plurality of elongated electrodes 122 which are formed in parallel with each other perpendicularly to the electrodes 120.

The transistor element in such structure can be manufactured in a similar manner to the aforementioned diode element.

For example, a solution of flavodoxin is dripped in a water vessel to form a monomolecular film of flavodoxin on the water surface. A substrate 116 provided with electrodes 117 is vertically inserted and dipped in the water vessel provided with the flavodoxin film, so that the flavodoxin film is adhered and joined to the substrate 116 having the electrodes 117 thereby to form a first electron transport protein film 118 joined to the electrodes 117, which first electron transport protein film is in turn taken out from the water vessel. Although the substrate 116 is inserted and dipped in the water vessel in the above case, the flavodoxin film may in place be vertically lifted from the water surface to be adhered and joined to the substrate 116. Metal thin films are formed on the first electron transport protein film 118 on the substrate 116 at such a low temperature that the electron transport protein is not broken through an ion beam method, a molecular beam method, an evaporation method or the like, thereby to obtain electrodes 120. Then, a solution of cytochrome c is dripped in the water vessel to form a monomolecular film of cytochrome c on the water surface. The substrate 116 previously provided with the first electron transport protein film 118 and the electrodes 120 is vertically inserted and dipped in the water vessel having the cytochrome c film whereby the cytochrome c film is adhered and joined on the first electron transport protein film 118 to form a second electron transport protein film 119 joined to the electrodes 120. Then the second electron transport protein film 119 is taken out from the water vessel. Thereafter in a similar manner, a flavodoxin film is adhered and joined on the second electron transport protein film 119 on the substrate 116 to form a third electron transport protein film 121, followed by formation of electrodes 122 thereon.

The respective electron transport protein films may be monomolecular films, or may in place be prepared by overlapping different types of electron transport protein films. In the latter case, redox potential difference between the electron transport proteins forming the overlapped electron transport protein films is selected, e.g., in case of the first electron transport protein film, to be smaller than redox potential difference between the electron transport proteins of the first and second electron transport protein films. As hereinabove described, the redox potential difference between cytochrome c and flavodoxin is about 665 mV. Further, lipid or fatty acid may be previously mixed into the electron transport protein solutions to be dipped in the water vessel to form the films to be adhered and joined to the substrate, so that the electron transport protein films are adjusted in orientation while the aforementioned lipid or fatty acid serves to support the protein molecules.

In order to improve electron transfer between Au electrodes and the electron transport proteins, the Au electrodes may be subjected to chemical modification by 4,4'-bipyridgl, 2,2'-bipyridgl or the like.

Although the first electron transport protein film 118 is interposed between the electrodes 117 and 120 in FIG. 9, insulation between the electrodes 117 and 120 is maintained since the first electron transport protein film 118 serves as a dielectric by itself. When the first, second and third electron transport protein films 118, 119 and 120 are accumulatedly adhered and joined with adjustment in orientation, electron transfer between the electrodes 117 and 122 is made possible. Although insulated with respect to the second electron transport protein film 119, the electrodes 120 can exert a voltage effect on the same, thereby to apply voltage. Thus, the electrodes 120 correspond to gate electrodes of a conventional FET, while the electrodes 117 and 122 correspond to source and drain electrodes respectively.

Figure 11A:
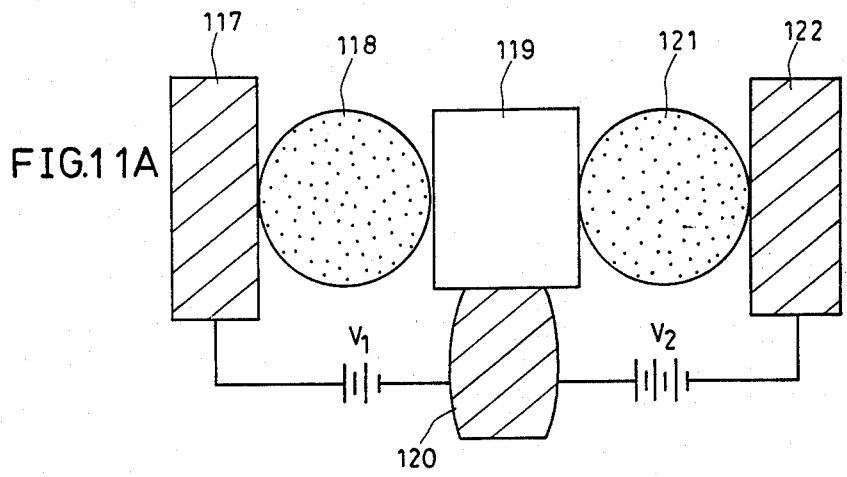
FIG. 11A is a typical diagram showing a state in which voltage is applied to the transistor element according to the embodiment of the present invention.
Figure 11B:
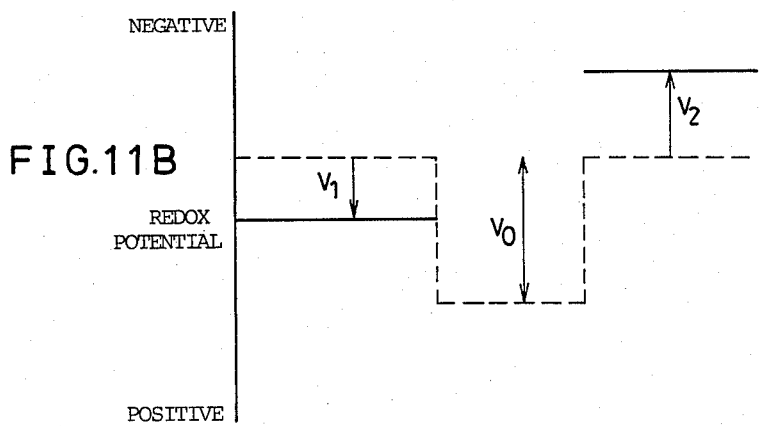
FIG. 11B is a diagram showing redox potentials of respective electron transport protein films of the transistor element as shown in FIG. 11.

FIG. 11A is a typical diagram showing a state of voltage application of the transistor element according to the embodiment of the present invention, and FIG. 11B is a diagram showing redox potential states of respective electron transport protein films of the transistor element.

When voltage $V_1$ is applied between the electrodes 117 and 120 with the electrodes 117 being positive and voltage $V_2$ is applied between the electrodes 120 and 122 with the electrodes 120 being positive, the redox voltage states are changed as indicated by solid lines in FIG. 11B. Broken lines indicate states before the voltage application, and symbol $V_0$ denotes redox potential difference between cytochrome c and flavodoxin, which difference is about 665 mV as hereinabove described. The redox potentials are considered to be changed by the aforementioned structure and voltage application similarly to those of a conventional semiconductor transistor (p-n-p junction type), whereby transistor characteristics are attained by the aforementioned structure in the device in a molecular level.

Enzyme may be employed to supply electrons to the electron transport proteins.

Examples of the electron transport proteins are non-heme iron-sulfur protein, cytochrome c protein, cytochrome b protein, flavodoxin, plastocyanin, thioredoxin and the like, and combination of the first, second and third electron transport proteins selected from the same is so selected that orientation between the molecules and orientation with respect to the substrate provided with the electrodes are suitable for electron transport.

Although the aforementioned transistor element has been described as formed by accumulated films of two types of proteins having different redox potentials, the same may be formed by accumulated films of three or more types of proteins having different redox potentials.

Further, the electron transport proteins are preferably oriented by the Langmuir-Blodgett method etc. through specificity in interaction between different types of electron transport proteins to be in specific molecular arrangement in the same type of electron transport protein film and in different types of electron transport protein films so that electron transfer is caused in the units of the electron transport protein molecules vertically to accumulated films while no such electron transfer is caused between the electron transport protein molecules in a horizontal direction with respect to the accumulated surfaces.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An electronic device comprising:
   a first electron transport protein film prepared by an electron transport protein having a first redox potential;
   a second electron transport protein film prepared by an electron transport protein having a second redox potential different from said first redox potential, said second electron transport protein film being joined to said first electron transport protein film;
   first electrodes connected to said first electron transport protein film; and
   second electrodes connected to said second electron transport protein film, difference between said first and second redox potentials being utilized to provide rectifying characteristics.

2. An electronic device in accordance with claim 1, wherein
   said electron transport proteins are selected from non-heme iron-sulfur protein, cytochrome c protein, cytochrome b protein, flavodoxin, plastocyanin and thioredoxin.

3. An electronic device in accordance with claim 1, wherein
said first and second electron transport protein films are monomolecular films.

4. An electronic device in accordance with claim 1, wherein
supply of electrons to said electron transport proteins is performed through enzyme.

5. An electronic device in accordance with claim 1, wherein
said first and second electrodes are metal electrodes.

6. An electronic device in accordance with claim 5, wherein
said metal electrodes are subjected to chemical modification by organic molecules.

7. An electronic device in accordance with claim 1, wherein
said electron transport proteins are oriented to be in specific molecular arrangement in the same type of electron transport protein film and in different types of electron transport protein films so that electron transfer is caused in the units of electron transport protein molecules vertically to junction between said first and second electron transport protein films while no such electron transfer is caused between said electron transport protein molecules horizontal to said junction.

8. An electronic device in accordance with claim 1, wherein
lipid or fatty acid is employed as a support for orientation of said electron transport proteins.

9. An electronic device having diode characteristics, comprising:
an insulated substrate;
a plurality of first elongated electrodes provided in parallel with each other on the upper surface of said insulated substrate;
a first electron transport protein film adhered and joined to said insulated substrate and the upper surfaces of said plurality of first elongated electrodes, said first electron transport protein film being prepared by an electron transport protein having a first redox potential;
a second electron transport protein film adhered and joined on the upper surface of said first electron transport protein film, said second electron transport protein film being prepared by an electron transport protein having a second redox potential different from said first redox potential; and
a plurality of second elongated electrodes provided in parallel with each other on the upper surface of said second electron transport protein film perpendicularly to said plurality of first elongated electrodes.

10. An electronic device comprising:
a first electron transport protein film prepared by an electron transport protein having a first redox potential;
a second electron transport protein film prepared by an electron transport protein having a second redox potential different from said first redox potential, said second electron transport protein film being joined to said first electron transport protein film;
a third electron transport protein film prepared by an electron transport protein having a third redox potential different from said second redox potential, said third electron transport protein film being joined to said second electron transport protein film;
first electrodes connected to said first electron transport protein film;
second electrodes connected to said second electron transport protein film; and
third electrodes connected to said third electron transport protein film, difference between said first, second and third redox potentials being utilized to provide at least one of transistor and switching characteristics.

11. An electronic device in accordance with claim 10, wherein
said electron transport proteins are selected from non-heme iron-sulfur protein, cytochrome c protein, cytochrome b protein, flavodoxin, plastocyanin and thioredoxin.

12. An electronic device in accordance with claim 10, wherein
said first, second and third electron transport protein films are monomolecular films.

13. An electronic device in accordance with claim 10, wherein
supply of electrons to said electron transport proteins is performed through enzyme.

14. An electronic device in accordance with claim 10, wherein
said first, second and third electrodes are metal electrodes.

15. An electronic device in accordance with claim 14, wherein
said metal electrodes are subjected to chemical modification by organic molecules.

16. An electronic device in accordance with claim 10, wherein
said electron transport proteins are oriented to be in specific molecular arrangement in the same type of electron transport protein film and in different types of electron transport protein films so that electron transfer is caused in the units of electron transport protein molecules vertically to junction between respective said electron transport protein films while no such electron transfer is caused between said electron transport protein molecules horizontal to said junction.

17. An electronic device in accordance with claim 10, wherein
lipid or fatty acid is employed as a support for orientation of said electron transport proteins.

18. An electronic device in accordance with claim 10, wherein
said first electrodes and said second electrodes are arranged perpendicularly to each other.

19. An electronic device in accordance with claim 18, wherein
said first and second electrodes are groups of elongated electrodes which are in parallel with each other respectively.

20. An electronic device in accordance with claim 10, wherein
said second electrodes and said third electrodes are arranged perpendicularly to each other.

21. An electronic device in accordance with claim 20, wherein said second and third electrodes are groups of elongated electrodes which are in parallel with each other respectively.

22. An electronic device having at least one of transistor and switching characteristics, comprising:

an insulated substrate;

a plurality of first elongated electrodes provided in parallel with each other on the upper surface of said insulated substrate;

a first electron transport protein film adhered and joined on said insulated substrate and the upper surfaces of said plurality of first elongated electrodes, said first electron transport protein film being prepared by an electron transport protein having a first redox potential;

a plurality of control electrodes provided in parallel with each other on the upper surface of said first electron transport protein film perpendicularly to said plurality of first elongated electrodes;

a second electron transport protein film adhered and joined to the upper surface of said first electron transport protein film as well as joined to said control electrodes, said second electron transport protein film being prepared by an electron transport protein having a second redox potential different from said first redox potential;

a third electron transport protein film adhered and joined to the upper surface of said second electron transport protein film, said third electron transport protein film being prepared by an electron transport protein having a third redox potential different from said second redox potential; and a plurality of second elongated electrodes provided in parallel with each other on the upper surface of said third electron transport protein film in parallel with said plurality of first elongated electrodes.

* * * * *